United States Patent [19]

Flickinger et al.

[11] Patent Number: 4,808,816
[45] Date of Patent: Feb. 28, 1989

[54] LED AND PIN DIODE CHARACTERIZATION BY PRODUCING A SCHEMATIC PROFILE OF RELATIVE INTENSITIES

[75] Inventors: Steven L. Flickinger, Hummelstown; Pamela R. Gutterman, Camp Hill; Wayne B. Hadley, Palmyra, all of Pa.

[73] Assignee: AMP Incorporated, Harrisburg, Pa.

[21] Appl. No.: 120,266

[22] Filed: Nov. 13, 1987

[51] Int. Cl.[4] .......................... H01J 5/16; H01J 40/14
[52] U.S. Cl. .................................. 250/227; 350/96.15
[58] Field of Search ...................... 250/227; 350/96.15, 350/96.18, 96.20

[56] References Cited

U.S. PATENT DOCUMENTS

| | | | |
|---|---|---|---|
| 4,452,506 | 6/1984 | Reeve et al. | 350/96.15 |
| 4,474,423 | 10/1984 | Bisbee et al. | 350/96.15 |
| 4,521,688 | 6/1985 | Yin | 250/363 S |
| 4,525,858 | 6/1985 | Cline et al. | 382/1 |
| 4,545,643 | 10/1985 | Young et al. | 350/96.15 |
| 4,594,001 | 6/1986 | DiMatteo et al. | 356/376 |
| 4,634,275 | 1/1987 | Yoshida et al. | 356/121 |
| 4,653,905 | 3/1987 | Farrar et al. | 356/4 |
| 4,678,271 | 7/1987 | Beaulieu | 350/96.20 |
| 4,684,883 | 8/1987 | Ackerman et al. | 324/71.5 |
| 4,687,325 | 8/1987 | Corby, Jr. | 356/1 |

*Primary Examiner*—David C. Nelms
*Assistant Examiner*—William L. Oen
*Attorney, Agent, or Firm*—Gerald K. Kita

[57] ABSTRACT

A method and apparatus for characterizing light emitting diodes (10) and PIN diodes (100) for coupled power degradation with varying offset is disclosed. An optical-electronic device such as a light emitting diode (10) or PIN diode (100) is scanned by an optical fiber (20) to obtain the output intensity of the LED (10) or the detection sensitivity of the PIN diode (100) as a function of position.

27 Claims, 6 Drawing Sheets

AUTOMATIC SCAN

SCAN DETAIL

LED AND PIN DIODE CHARACTERIZATION BY PRODUCING A SCHEMATIC PROFILE OF RELATIVE INTENSITIES

FIELD OF THE INVENTION

The present invention relates to the characterization of optical-electronic devices such as light emitting diodes (LEDs) and PIN diodes and, more particularly, to the characterization of LEDs and PIN diodes for coupled power degradation with varying offset.

BACKGROUND OF THE INVENTION

In a fiber optic link, optical signals are transmitted via an optical fiber from a transmitter which comprises a light emitting device such as an LED or diode laser to a receiver which comprises a detector such as a PIN diode. The determination of coupled optical power as a function of position is important in the engineering of the LED-to-fiber coupling in the transmitter and the fiber-to-PIN diode coupling in the receiver In particular, when a fiber optic link is designed, it is desirable to achieve maximum LED-to-fiber and fiber-to-PIN diode coupling. Thus, a fiber link is preferably designed with a good understanding of how the coupling varies with variations of the fiber position relative to the position of peak LED output intensity in the case of the transmitter or the position of peak PIN diode detection sensitivity in the case of the receiver. In other words, it is important to know the tolerances of the LED-to-fiber coupling in the transmitter and the fiber-to-PIN diode coupling in the receiver.

To determine such tolerances, it is necessary to determine the optical output intensity of the LEDs as a function of position relative to the maximum output intensity. Similarly, in the case of a PIN diode, it is necessary to determine the detection sensitivity of a pin diode as a function of position relative to the peak detection sensitivity.

This information provides significant benefits. For example, a very expensive transmitter due to tight LED-to-fiber tolerancing would not be necessary if the output intensity of the LED does not decrease significantly as the position of the fiber is offset from the position of peak output intensity. On the other hand, tight tolerances would be important if the output intensity of an LED varied sharply relative to the position of peak output intensity. In short, in order to design an optimal optical fiber link, it is desirable to understand how the power coupled between an optical-electronic device and an optical fiber degrades with varying offset.

In view of the above, it is an object of the present invention to provide a method and an apparatus which enables the characterization of optical-electronic devices such as LEDs and PIN diodes for coupled power degradation with varying offset.

It is a further object of the invention to provide a method and an apparatus which enables the determination of output intensity profiles for LEDs and other light emitting devices.

It is also an object of the invention to provide a method and an apparatus which enables the determination of detection sensitivity profiles for PIN diodes and other light detecting devices.

SUMMARY OF THE INVENTION

The apparatus and method of the present invention provide output intensity profiles for LEDs and/or diode lasers and detection sensitivity profiles for photodetectors such as PIN diodes. In such profiles, the output intensity of an LED or the detection sensitivity of a PIN diode is determined as a function of position.

To produce an output intensity profile for an LED, an input end of an optical fiber is first positioned a predetermined distance (along the Z axis) from a reference plane of the LED. Illustratively, if the LED is packaged in a conventional TO can, the reference plane includes the surface of the TO can that comes into contact with an Active Device Mount (ADM) when the LED is used in an actual optical fiber system.

After the input end of the fiber is positioned a predetermined distance from the reference plane, the input end of the fiber is moved in a plane parallel to the reference plane (i.e. in an X-Y plane, identified herein as a "scanning" plane, separated from the reference plane by the predetermined distance along the Z axis) until the position is found at which the maximum intensity of radiation is coupled into the fiber as indicated by a power meter located at the output end of the fiber. At this point characterization of the device becomes automated. A scan is performed by moving the input end of the fiber in discrete steps to a plurality of positions in the above-mentioned X-Y plane under the control of a computer. The step size and number of steps in each direction are input to a stored program of the computer. At each position in the X-Y plane, the intensity of radiation coupled into the fiber is detected, stored and categorized by increments of displacement over the position of the maximum coupled intensity. The detected intensity values are stored and analyzed in the computer to produce the desired profile. The area needed to be scanned depends upon the device and type of output profile required for particular applications.

A detection profile for a PIN diode is obtained in a similar manner. In particular, an optical signal is applied to the input end of a fiber. An output end of the fiber is positioned a predetermined distance (along the Z axis) from a reference plane of the PIN diode. The fiber output end is moved in a scanning plane oriented parallel to the reference plane (i.e. in an X-Y plane separated from the reference plane along the Z axis by the predetermined distance) until the position of peak detection sensitivity is found. A scan is then performed by moving the fiber output end in discrete steps to a plurality of positions in the X-Y plane (i.e. in the scanning plane) under the control of a computer to provide the detection sensitivity profile which comprises measurements of the detection sensitivity at each incremental position relative to the position of maximum detection sensitivity.

DETAILED DESCRIPTION OF THE INVENTION

Figure 1:
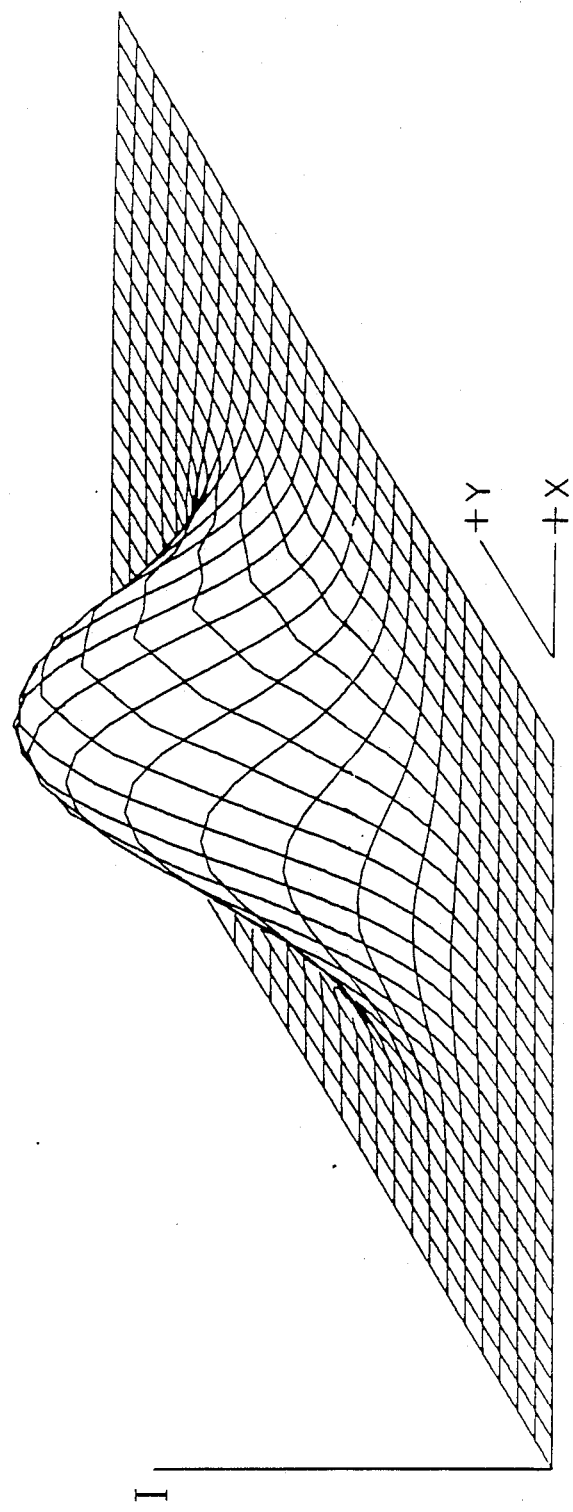
FIG. 1 schematically illustrates an output intensity profile in three dimensions of an LED produced in accordance with the present invention.

FIG. 1 is an output intensity profile of an LED. The X and Y axes define a plane oriented parallel to a reference plane of the LED. Values along the axis designated I represent the intensity of output radiation from the LED coupled into an optical fiber input end located at the corresponding position in the X-Y plane. To produce the intensity profile of FIG. 1, the input end of the fiber is stepped through various positions in the X-Y (or scanning) plane under the control of a computer. At each position the intensity of radiation coupled into the fiber is measured to be compared relative to the peak coupled intensity by means of a detector coupled to the output end of the fiber. The apparatus and method for accomplishing this is described in greater detail below. FIG. 1 shows exactly how far the fiber input end can be offset from the position of maximum coupled intensity without the coupled radiation intensity being significantly reduced. In the particular profile of FIG 1, the output intensity falls off rather rapidly in the X and Y directions from the position of maximum output intensity.

It should be noted that the output intensity profile of a device such as an LED depends on the size of the fiber that the emitted radiation is coupled into. Therefore, it is desirable to analyze the output of LEDs with different size fibers. If the coupled power varies significantly from one fiber size to another, or from one fiber construction to another fiber construction, then the worst case loss may be taken into account when the tolerancing of a system is specified.

Figure 2:
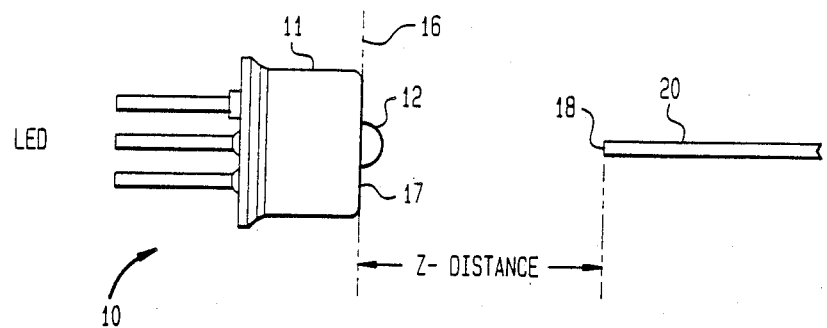
FIG. 2 schematically illustrates a device such as an LED which may be characterized in accordance with the present invention to produce an intensity profile of the type shown in FIG. 1.

FIG. 2 illustrates a typical LED 10 which is contained in a TO-18 style package 11. The LED 10 is packaged with a protruding lens 12 whose focal point is illustratively 0.075 inches from a reference plane 16 of the LED along the Z axis. An example of such an LED is the LYTEL LE-0399 available from LYTEL, Incorporated. When used in an actual optical fiber system, the input end 18 of an optical fiber 20 would be positioned 0.075 inches from the reference plane. Thus, for purposes of obtaining intensity profiles as a function of position for the LED of FIG. 2, it is desirable to maintain the fiber input end 18, a fixed distance (e.g. 0.075 inches) from the reference plane. Alternatively, for the purpose of verifying the location of the focal plane of the LED, intensity profiles for several distances, separating the end of the fiber from the reference plane, are taken and compared to one another. In an actual optical fiber system, an Active Device Mount (ADM), not shown in FIG. 2, would be used to position the fiber relative to the LED. In connection with this, it should be noted that the reference plane of an LED may be defined as the plane which includes the surface of the device package (e.g. the surface 17 of FIG. 2) that comes into actual contact with a mating surface of the Active Device Mount.

As indicated above, the output intensity profile of an LED varies with the size of the fiber used to obtain the profile. Illustratively, the fiber may be a 50/125 micron (micrometer) fiber, a 62.5/125 micron fiber, an 85/125 micron fiber or a 100/140 micron fiber.

Figure 3:
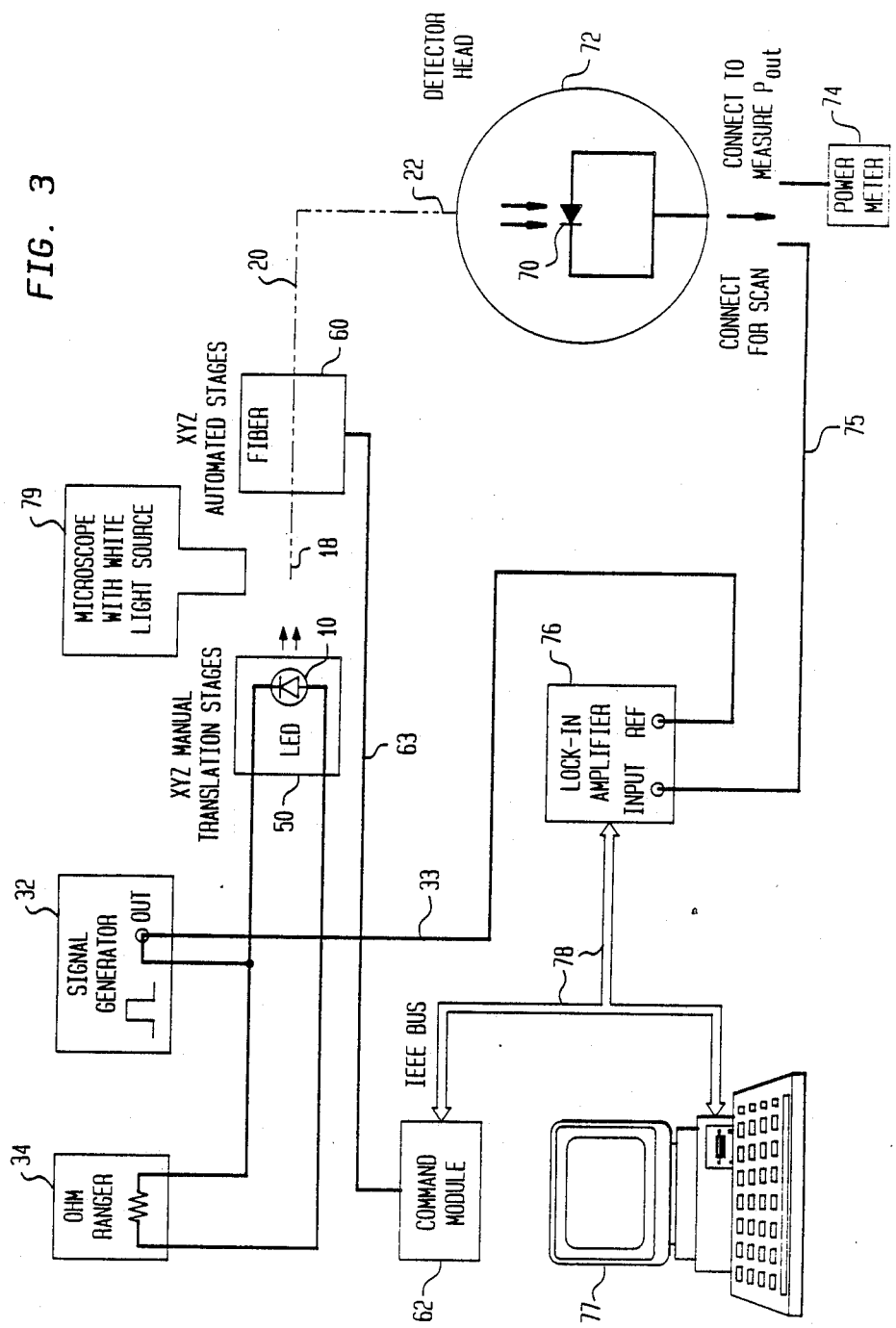
FIG. 3 schematically illustrates an apparatus used for obtaining an output intensity profile of an LED in accordance with the present invention.

Turning to FIG. 3, an apparatus for characterizing the output intensity of an LED as a function of position is illustrated. The LED 10 to be characterized is driven by a signal generator 32 which produces square wave pulses having a predetermined duty cycle. The Ohm-Ranger Box 34 provides a variable resistance which can be used to set the current flowing through the LED to a predetermined amount. Illustratively, the Ohm-Ranger Box is a Model 3420 by Ohmite Mfg.

Figure 4:
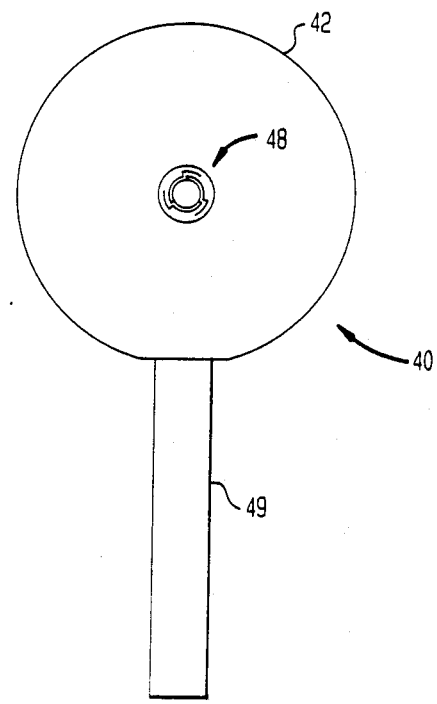
FIG. 4 illustrates a holder for holding an LED suitable for use in connection with the apparatus of FIG 3.

To ensure repeatability of the measurements, the device 10 is held rigid by means of a self-centering holding fixture. The holding fixture is illustrated in FIG. 4. The holding fixture 40 comprises an apertured disk 42 whose inner diameter is smaller than the diameter of the TO cans (see FIG. 2) of the devices to be inserted in the aperture. This enables the spring arms 48 to expand when the TO can is inserted to hold the device firmly in place. In FIG. 4 three arms 48 are shown, which arms are spaced 120 degrees apart to evenly distribute pressure on the devices inserted into the aperture. Illustratively, the disk 42 is a three inch diameter, one-half inch thick piece of steel. Illustratively, the disk 42 is mounted on a post 46 which may be three inches long. The post may be mounted onto a rotational base attached to the XYZ manual translation stages 50 of FIG. 3. The manual translation stages (Model 430-I) with rotational base (Model 470-1) are available from the Newport Corp. The manual translation stages 50 are held stationary during the characterization of the LED device but are adjusted to change holding fixture assemblies 40.

Illustratively, the fiber 20 is about 2 meters in length. The output end 22 of the fiber may be terminated using an OPTIMATE (Trademark of AMP, Incorporated) simplex type connector and polished. The input end 18 may be stripped and cleaned so that about 2 inches of bare fiber remains. The fiber input end has an end angle less than about two degrees to allow maximum light to be transmitted into the fiber. The bare fiber is then inserted into a fiber clamp (not shown) such as the Model FPM-C Fiber Cable Clamp of the Newport Corporation so that about ¼ inch of fiber protrudes from the front of the fiber clamp. The fiber clamp is placed in a fiber optic positioner (not shown) such as the Model FP2-B2 from the Newport Corporation which in turn is mounted on automated translation stages 60 such as the stages comprising part of the Burleigh micropositioning system. This micropositioning system includes a command module 62 such as the CE-2000 command module. The command module sends signals to the translation stages 60 via lines 63 to control the movement of the translation stages 60. The translation stages can move the input end 18 of the fiber 20 in discrete steps along any of three mutually orthogonal axes.

Light coupled into the fiber from the LED 10 is detected by the photodiode 70 which illustratively comprises part of a detector head 72 which is available from Photodyne. The output of the photodiode 82 may be connected to a power meter 74 such as a Photodyne power meter which is capable of measuring absolute intensity or power levels and via line 75 to a lock-in amplifier 76 such as an EG&G model 5301. The lock-in amplifier 76 measures relative power. The lock-in amplifier 76 is connected to the signal generator via line 33 so the lock-in amplifier is informed of the wave form being used to drive the LED 10. This enables the lock-in amplifier to discriminate between signals produced by the LED 10 and signals produced by other sources of light such as 60 Hertz sources and constant sources. A computer 77 is connected to the lock-in amplifier 76 and command module 62 via a bus 78 such as an IEEE general purpose interface bus. Illustratively, the computer is a Hewlett-Packard Corporation 9000 Series 200.

Using the microscope 79 and the command module 62, the fiber 20 is butted up against the device 10. A white light source may be utilized to illuminate the fiber and device for proper viewing through the microscope. The translation stages 60 carrying the fiber 20 should be moved at a slow translation speed so as not to crash the endface of the fiber upon contact with the device. The fiber is then backed off a predetermined distance from the reference plane of the device along the Z axis. This operation is performed manually through use of a keyboard or keypad (not shown) which forms part of the command module 62.

To determine the output intensity profile for a particular device 10, the location of the peak coupling power is first obtained by adjusting the position of the output end of the fiber in the X-Y plane relative to the device. Positioning of the input fiber end for the peak coupled power reading is done manually through use of the keypad associated with the command module 62. The lock in amplifier provides a high resolution reading of the relative coupled power for each position of the input fiber. The position of the fiber corresponding to the relative peak coupled power reading is determined by comparison of all readings of the lock in amplifier. The approximate peak coupled power at the corresponding position of the output of the fiber is determined absolutely through use of the power meter 74. All other coupled power measurements are relative to the peak coupled power.

At this point the characterization process for the devices 10 comes under the control of the computer 77. Automation of the data collection process through use of the computer 77 provides several significant advantages. If the scan is done by the manual adjustment of the stages 60, together with writing down the positions and power readings, the collection of the data becomes very tedious and error prone. Automating the data collection speeds up the process somewhat. In addition, automation enables the data collection to proceed unattended and the probability of incorrect numbers is minimized.

Figure 5:
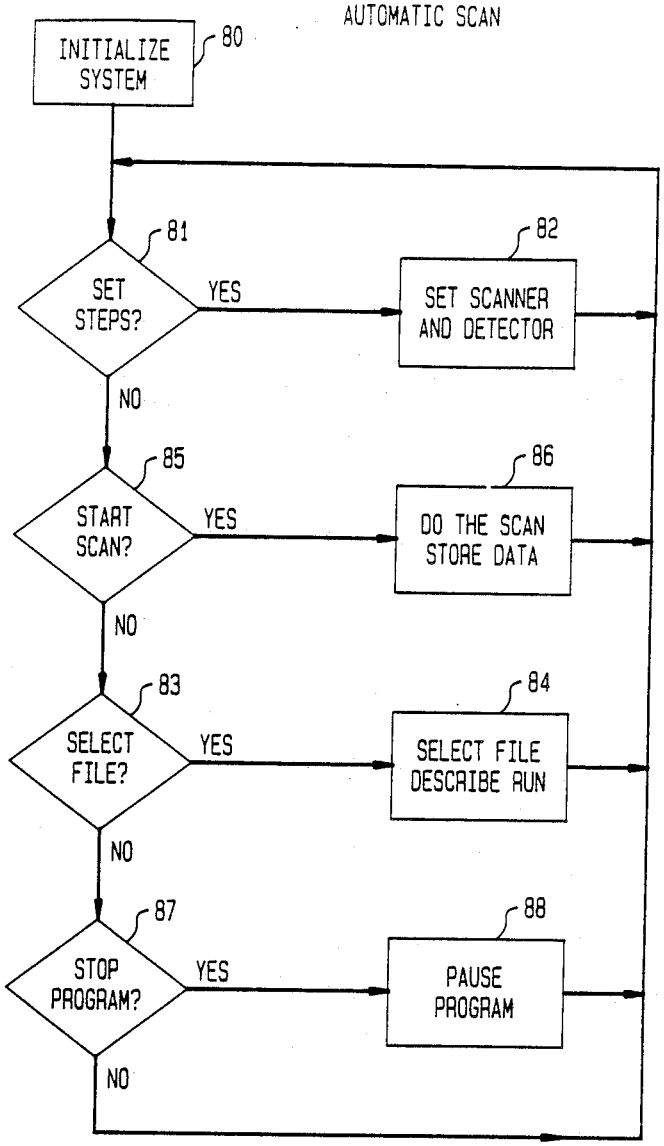
FIGS. 5 and 6 are flow charts of a computer program used to control the movement of an optical fiber to obtain the output intensity profile of an LED in accordance with the present invention.

The flow chart of FIG. 5 is an overview of the computer program utilized in the computer 77. At the start of the characterization process, even before the location of peak intensity coupling is determined, the computer program is initialized (block 80) through the provision of parameters concerning the automatic translation stages 60, the command module 62, and the lock-in amplifier 76 (blocks 81, 82). At this point, it is also possible to provide preliminary values as to the step size and number of steps in each direction for the scan of the fiber input end.

Either before or after the scan a storage place for the scan data is inputted along with a description of the scan (blocks 83, 84). After the actual scan is performed (blocks 85, 86) and the file description is provided (blocks 83, 84), the program may be stopped (blocks 87, 88).

Figure 6:
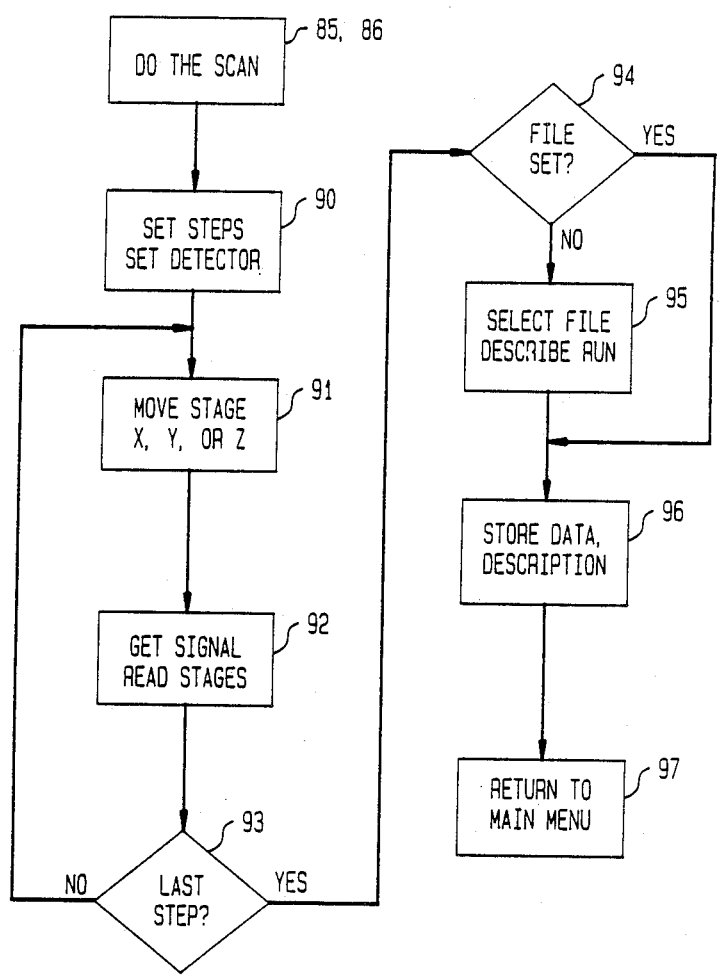

FIG. 6 illustrates the actual scan (blocks 85, 86 of FIG. 5) in greater detail. The computer 77 controls the scan of the fiber input end by sending electronic signals to the command module 62 via the bus 78. Similarly, the computer collects data from the lock-in amplifier via the bus 78.

Before the start of the scan, there is a further opportunity to adjust the step size and number of steps in each direction. In addition, the sensitivity setting of the lock-in amplifier can be adjusted (block 90). The X-Y positions should be set at maximum signal when the sensitivity is set so that the lock-in amplifier will not overload during the scan.

The scan (block 91) starts at one corner of the X-Y field (see FIG and proceeds in the positive X (horizontal) direction. At the end of the X range, a step is taken in the positive Y (vertical direction) and the scan goes on in the negative X direction. If more than one position in the Z (axial) direction is specified, an identical X-Y scan is performed for each value of Z. For each data point, all three spatial coordinates are recorded along with a relative intensity value (block 92). After the last step (block 93), the scan terminates. If the file description has been specified, the data is stored automatically. Otherwise the operator must supply a file selection and description before the data is stored (block 95). After the data and description are stored (block 96), the program then returns to the main program menu (block 97) shown in FIG. 5.

Figure 7:
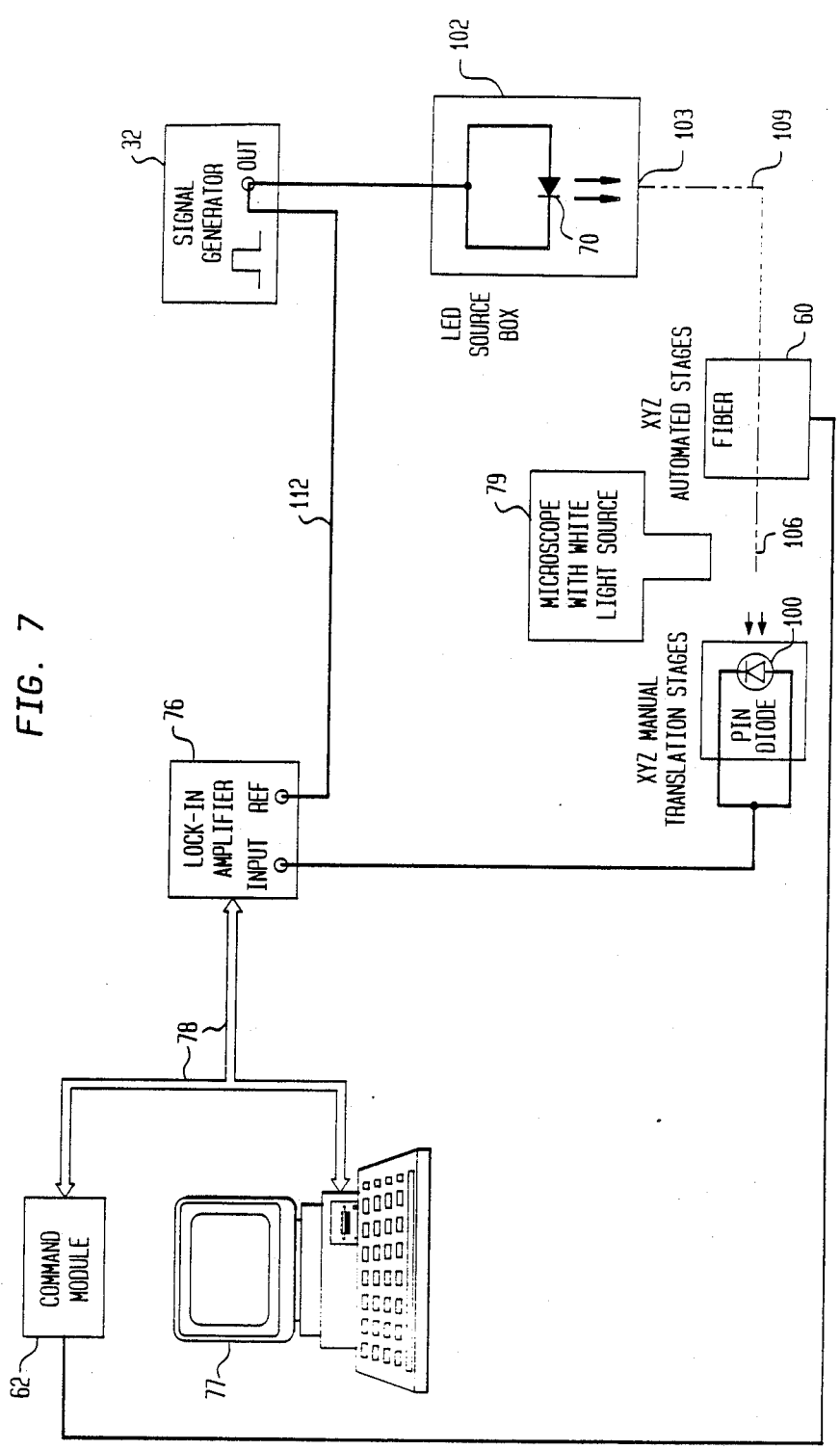
FIG. 7 schematically illustrates an apparatus used for obtaining a detection sensitivity profile of a PIN diode in accordance with the present invention.

Turning to FIG. 7, a system for characterizing the detection sensitivity of a PIN diode as a function of position is illustrated. Like elements in FIGS. 3 and 7 have the same identifying numerals.

The PIN diode 100 to be characterized is mounted in a self-centering holding fixture such as the one illustrated in FIG. 4. This fixture is mounted on the XYZ translation stages 50 which, as indicated above, are not used in the characterization process but are used only when the holding fixture is changed. An optical signal is generated by LED 102 which is driven by the signal generator 32. The optical signal from the LED 102 is applied to the input end 103 of the fiber 104. The output end 106 of the fiber 104 is mounted on the automated XYZ translation stages 60 described in detail in connection with FIG. 3. The stages 60 are movable in discrete steps in any of three mutually perpendicular axes under the control of the command module 62. The PIN diode 100 is connected to the lock-in amplifier 76 via line 110. The lock-in amplifier is also connected via line 112 to the signal generator 32. This enables the lock-in amplifier to discriminate between signals resulting from LED 102 and ambient light sources. As in the system illustrated in FIG. 3, the lock-in amplifier, the command module 62 and the computer 77 are interconnected by means of the bus 78.

Using the microscope 79 and the command module 62, the output end 106 of the fiber 104 is manually positioned a predetermined distance (along the Z axis) from the reference plane of the device 100. Light coupled into the fiber 104 from the LED 102 is detected by the PIN diode 100. To determine the detection sensitivity profile of the device 100, the location of peak detection sensitivity is obtained by adjusting the position of the output end of the fiber in a plane parallel to the reference plane (i.e. in an X-Y plane spaced apart from the reference plane along the Z axis by the predetermined distance) through use of the keypad connected to the command module 62. At this point the characterization process comes under the control of the computer 77, which causes the output end of the fiber to move in discrete steps to a plurality of positions in the X-Y plane. At each step a detection sensitivity measurement is made by the lock-in amplifier 76, the measurement values being stored and analyzed in the computer 77. The detection sensitivity value at each position in the X-Y plane is measured for comparison relative to the peak detection sensitivity value.

The characterization of the output profile is particularly useful to a designer of an optical connector. An optical connector, known also as a device mount, mounts an optical device, either an LED or diode laser, and mounts an optical fiber in a position relative to the optical device to assure maximum transfer of optical energy between the optical device and the fiber. Before the invention, the optimum position of the fiber relative to the optical device was unpredictable. To overcome such unpredictability, prior optical connectors required trial and error adjustment rather than fixed mounts for an optical device and for a fiber. Adjustments in the mounts were required to select the final positions of the optical device and the fiber in the X-Y plane and Z direction, thereby to assure sufficient transfer of optical energy between the optical device and the fiber. An optical connector constructed with a fixed mount for the optical device and a fixed mount for the fiber will automatically position the optical device and the fiber for maximum transfer of optical energy. The optical device and the fiber would be capable of assembly with the optical connector in fixed positions without a need to adjust their positions for maximum transfer of optical energy.

The following is a description of a procedure for designing an optical connector with fixed mounts, utilizing characterization information of an optical device such as an LED. First, the typical LED 10 and a representative fiber 20 is placed in the apparatus for characterizing the output intensity. The output intensity profile of the optical device is obtained for a predetermined distance or dimension along the Z axis. This dimension along the Z axis corresponds to the dimension in an optical connector separating the fixed mounts for the optical device and for the fiber that will produce the same output intensity profile in the X-Y plane as obtained by the test apparatus. This output intensity profile indicates a position in the X-Y plane at which the output intensity of radiation is a relative maximum intensity. It is desirable to duplicate this same position in an optical connector. That is, the fixed mount of the fiber and the fixed mount of the optical device in the connector are selected with dimensions that duplicate the position. Thereby, the output intensity profile obtained by the apparatus is used to predict the actual profile that results if a fixed mount of an optical fiber and a fixed mount of the optical device are positioned in an optical connector with the same X-Y and Z dimensions while under test in the apparatus. These corresponding positions, in the X-Y plane and in the Z direction will vary from one connector to another due to different dimensions allowed by manufacturing tolerances. The output intensity profiles are obtained for the upper and lower limits of each dimension in the X-Y plane and the Z direction. These profiles are used to predict the actual output intensities resulting from the selected tolerances. If the tolerances are relatively large, the output intensities predicted will be lower than desired. If the tolerances are too confining, they can be enlarged up to a limit that will produce predicted output intensities that would be lower than desired.

The output intensity profile is obtained for each of several values of distances along the Z axis. Characterization of the position in the X-Y plane will indicate and predict the distribution of the output intensity over increments of distance in the X-Y plane. Characterizations in the X-Y plane are made for multiple different dimensions in the Z direction. These characterizations will indicate and predict the effect an output intensity and distribution caused by different dimensions in the Z direction. This information will be useful to a designer of an optical connector to match the size of optical fiber with the X-Y distribution of the output intensity, and to select the manufacturing tolerances for X-Y and Z dimensions of an optical connector. The X-Y and Z dimensions will be allowed to vary within the manufacturing tolerances. These varying dimensions will produce variations in the distribution of output intensity and different characterizations of output intensity.

Characterizations are made for multiple optical devices of the same family to provide a statistical range of distributions of output intensities for the family. This range of distributions provides to a designer of an optical connector a corresponding range of X-Y and Z dimensions for the positions of the fixed mounts in an optical connector.

Finally, the above-described embodiments of the invention are intended to be illustrative only. Numerous alternative embodiments may be devised by those skilled in the art without departing from the spirit and scope of the following claims.

We claim:

1. An apparatus for characterizing the intensity coupling between a light emitting semiconductor device and an optical fiber, said apparatus comprising:
   a signal generator for applying a driving current to said light emitting device,
   translation means on which an input end of said optical fiber is mounted, said translation means being capable of moving said input end of said optical fiber along any of three mutually perpendicular axes,
   control means for applying electronic signals to said translation means to cause said translation means to move said input end of said fiber to particular positions,
   detecting means for detecting the intensity of radiation coupled into said fiber from said device at said positions for comparison relative to a maximum coupled intensity, wherein the maximum coupled intensity is obtained by locating the fiber at an initial position along said axes,
   recording means for recording relative intensities, wherein each relative intensity is a comparison of a corresponding detected intensity and the maximum coupled intensity, and
   producing means for producing a schematic profile of the relative intensities to indicate a distribution of the intensity coupling between the fiber and the device.

2. The apparatus of claim 1 wherein said control means is operable by a computer to cause said translation means to move the input end of the optical fiber in discrete steps to a plurality of positions located opposite a reference plane of said device.

3. The apparatus of claim 2 wherein said detecting means comprises a lock-in amplifier.

4. The apparatus of claim 3 wherein said lock-in amplifier is connected to said computer so that said detected intensity values can be stored and analyzed by said computer.

5. The apparatus of claim 4 wherein said lock-in amplifier is connected to said signal generator.

6. An apparatus for characterizing the power coupling between an optical fiber and a light detecting semiconductor device comprising:
   means for applying an optical signal to an input end of said fiber,
   translation means on which an output end of said fiber is mounted, said translation means being capable of moving the output end of said fiber along any of the three mutually perpendicular axes,
   control means for applying electronic signals to said translation means to cause the output end of said fiber to move in discrete steps to a plurality of positions,
   means for measuring the detection sensitivity of said device at each of said positions for comparison relative to a peak detection sensitivity, wherein the peak detection sensitivity is obtained by locating the fiber at an initial position along said axes,
   recording means for recording the detection sensitivities relative to the peak detection sensitivity, and
   producing means for producing a schematic profile of the relative detection sensitivities to indicate a distribution of the detection sensitivities of said device.

7. The apparatus of claim 6 wherein said measuring means includes a lock-in amplifier.

8. The apparatus of claim 7 wherein said lock-in amplifier is in communication with said optical signal applying means.

9. The apparatus of claim 6 wherein said apparatus further includes a computer for operating said control means and for storing and analyzing said measured detection sensitivity values.

10. A method for characterizing a radiation output of a light emitting semiconductor device, comprising the steps of:
    positioning an input end of an optical fiber in a scanning plane oriented parallel to and located a predetermined distance from a reference plane of said device,
    moving said input end in said scanning plane while detecting radiation output coupled into said fiber to find a first position in said scanning plane at which a maximum intensity of radiation output of said device is coupled into said fiber and is detected,
    moving said input end in discrete steps to a plurality of second positions in said scanning plane and proximate to said first position,
    detecting an intensity of radiation output coupled into said input end for each of said second positions,
    recording a relative intensity of radiation output for each of said plurality of second positions, wherein each relative intensity is a comparison of a corresponding detected intensity with said maximum intensity, and
    producing a schematic profile of the recorded relative intensities to indicate a distribution in the scanning plane of the radiation output of said device.

11. A method as recited in claim 10, wherein he step of moving said input end in discrete steps to a plurality of second positions in said scanning plane, further includes the step of moving said input end of said fiber under the control of a computer.

12. A method as recited in claim 10, wherein the step of detecting an intensity of radiation output coupled into said input end for each of said second positions, further includes the step of detecting said intensity of radiation output under the control of a computer.

13. A method as recited in claim 10, wherein the step of recording a relative intensity of radiation output for each of said plurality of second positions, further includes the step of recording said relative intensity under the control of a computer.

14. A method as recited in claim 10, wherein the step of producing a schematic profile of the recorded relative intensities to indicate the distribution in the scanning plane of the radiation output of said device, further includes the step of providing said schematic profile of the relative intensities under the control of a computer.

15. A method as recited in claim 10, and further including the steps of:
    specifying said predetermined distance as a dimension applied to an optical connector, said dimension separating said reference plane of said device mounted in a first fixed mount of said connector and a corresponding optical fiber mounted in a second fixed mount of said connector, and
    specifying a size of said corresponding optical fiber to correspond with the size of said distribution of said radiation output of said device.

16. A method as recited in claim 15, and further including the steps of:
    repeating the method steps recited in claim 10 to provide a schematic profile of recorded relative intensities for each of two additional scanning planes located at corresponding distances from said first recited scanning plane, and
    specifying said corresponding distances as tolerances for said dimension to be applied to said connector.

17. A method as recited in claim 10, and further including the steps of:
    obtaining a statistical range of distributions of radiation outputs of duplicates of said semiconductor light emitting device, by performing the method steps recited in claim 10 on each of said duplicates.

18. A method as recited in claim 10, and further including the steps of:
    positioning said input end successively in additional scanning planes,
    moving said input end of the fiber to a plurality of additional positions along each of the additional scanning planes,
    recording the intensity of radiation output coupled into said input end at each of the additional positions, and
    producing a schematic profile of the recorded relative intensities for each of the additional scanning planes to indicate a distribution in each of the scanning planes of the radiation output of said device.

19. A method for characterizing the light detection sensitivity of a semiconductor light detecting device, comprising the steps of:
    positioning an output end of an optical fiber in a scanning plane oriented parallel to and located a predetermined distance from a reference plane of aid device,
    coupling an optical test signal into an input end of said fiber,
    moving said output end in said scanning plane, while detecting an intensity of said test signal coupled into said device by said fiber, to fine a first position of said fiber that corresponds to a peak in said intensity, moving said output end in discrete steps to a plurality of second positions in said scanning plane and proximate to said first position, detecting an intensity of said test signal coupled into said device for each of said second positions, recording a relative intensity of said test signal for each of said plurality of second positions, wherein each relative intensity is a comparison of a corresponding detected intensity with said peak in said intensity, and producing a schematic profile of the recorded relative intensities to indicate a distribution in the scanning plane of the detection sensitivity of said device.

20. A method as recited in claim 19, wherein the step of moving said input end in discrete steps to a plurality of second positions in said scanning plane, further includes the step of moving said input end under the control of a computer.

21. A method as recited in claim 19, wherein the step of detecting a intensity of said test signal coupled into said device for each of said second positions, further includes the step of detecting said intensity of said test signal under the control of a computer.

22. A method as recited in claim 19, wherein the step of recording a relative intensity of said test signal for each of said plurality of second positions, further includes the step of recording each said relative intensity under the control of a computer.

23. A method as recited in claim 19, wherein the step of producing a schematic profile of the recorded relative intensities to indicate a distribution in the scanning plane of the detection sensitivity of said device, further includes the step of providing said schematic profile of the relative intensities under the control of a computer.

24. A method as recited in claim 19, and further including the steps of:

specifying said predetermined distance as a dimension applied to an optical connector, said dimension separating said reference plane of said device mounted in a first fixed mount of said connector and a corresponding optical fiber mounted in a second fixed mount of said connector, and specifying a size of said corresponding optical fiber to correspond with the size of said distribution of said detection sensitivity of said device.

25. A method as recited in claim 24, and further including the steps of:

repeating the method steps recited in claim 3 to provide a schematic profile of recorded relative intensities for each of two additional scanning planes located at corresponding distances from said first recited scanning plane, and specifying said corresponding distances as tolerances for said dimension.

26. A method as recited in claim 19, and further including the steps of:

obtaining a statistical range of distributions of detection sensitivities of duplicates of a semiconductor light detecting device, by performing the method steps recited in claim 3 on each of said duplicates.

27. A method as recited in claim 19, and further including the steps of:

positioning said input end successively in additional scanning planes, moving said input end to a plurality of additional positions along each of the additional scanning planes, detecting an intensity of the test signal coupled into said device for each of the additional positions, recording the relative intensity of said test signal coupled into said device at each of the additional positions, wherein the relative intensity is derived by a comparison of the detected intensity with said peak in said intensity, and producing a schematic profile of the recorded relative intensities for each of the additional scanning planes to indicate a distribution in each of the scanning planes of the detection sensitivity of said device.

* * * * *